United States Patent [19]

Morigami

[11] Patent Number: 5,070,295

[45] Date of Patent: Dec. 3, 1991

[54] POWER-ON RESET CIRCUIT

[75] Inventor: Takashi Morigami, Tokyo, Japan

[73] Assignee: NEC Corporation, Tokyo, Japan

[21] Appl. No.: 687,387

[22] Filed: Apr. 18, 1991

[30] Foreign Application Priority Data

Apr. 20, 1990 [JP] Japan .................................. 2-104462

[51] Int. Cl.$^5$ ............................................. G05F 3/24
[52] U.S. Cl. ..................................... 323/314; 323/316;
323/901
[58] Field of Search ............... 323/311, 312, 313, 314, 323/315, 316, 901

[56] References Cited

U.S. PATENT DOCUMENTS

| 3,867,685 | 2/1975 | Ahmed | 323/316 |
| 3,911,353 | 10/1975 | van de Plassche | 323/315 |
| 4,087,758 | 5/1978 | Hareyama | 323/314 |
| 4,300,091 | 11/1981 | Schade, Jr. | 323/315 |
| 4,574,232 | 3/1986 | Petty | 323/901 |
| 4,617,509 | 10/1986 | Tomisawa | 323/901 |
| 4,673,866 | 6/1987 | Masuda | 323/313 |
| 4,692,689 | 9/1987 | Takemae | 323/313 |
| 4,788,455 | 11/1988 | Mori et al. | 323/314 |
| 4,990,846 | 2/1991 | Buck et al. | 323/314 |

Primary Examiner—Peter S. Wong
Attorney, Agent, or Firm—Helfgott & Karas

[57] ABSTRACT

A power-on reset circuit has first and second reference potential circuits and a comparator. The first and second reference potential circuits are such that their output voltage curves with respect to the power supply voltages intersect at a predetermined power supply voltage. The comparator compares output voltages of the first and second reference potential circuits. The first reference potential circuit has a first and a second resistor connected in series and a first non-linear resistor element circuit all connected between a first and a second power supply terminal. A node between the first and second resistors forms an output terminal of the first reference potential circuit. The second reference potential circuit has a third, fourth and fifth resistors connected in series between the first and second power supply terminals and a second non-linear resistor element circuit connected in parallel to the fourth resistor. A node between the third and fourth resistors forms an output terminal of the second reference potential circuit. According to this arrangement, even when the power supply voltage is low, a change in the output voltage of the first reference potential circuit and that in the second reference potential circuit occur on characteristic lines different from each other so that the two output voltages will never become the same voltage.

5 Claims, 4 Drawing Sheets

H: Reset
L: Reset released

POWER-ON RESET CIRCUIT

BACKGROUND OF THE INVENTION

The present invention relates to a power-on reset circuit and, more particularly, to a power-on reset circuit for having a reset signal released or set under such time as when a power supply voltage rises or falls.

As shown in FIG. 5, a power-on reset circuit is connected to an internal circuit and operates to release a reset state of the internal circuit in accordance with the transition of its output signal from "High" to "Low" level, and to reset the internal circuit in accordance with the transition of its output signal from "Low" to "High" level.

A conventional power-on reset circuit of this kind to which the present invention relates comprises, as shown in FIG. 6, a first reference potential circuit 21, a second reference potential circuit 22 and a comparator circuit 3. The first reference potential circuit 21 and the second reference potential circuit 22 are so designed that the respective output voltage curves with respect to the power supply voltages are different from each other and intersect with each other at a predetermined power supply voltage, namely, at the reset release voltage or the set voltage. The comparator circuit 3 compares an output voltage Vb of the first reference potential circuit 21 and an output voltage Va of the second reference potential circuit 22.

The first reference potential circuit 21 comprises resistors $R_{11}$, $R_{12}$ and diodes $D_{11}$, $D_{12}$, $D_{13}$, all connected in series between a power supply terminal $V_{DD}$ and a ground terminal. The second reference potential circuit 22 comprises resistors $R_{13}$, $R_{14}$ and diodes $D_{14}$, $D_{15}$, all connected in series between the power supply terminal $V_{DD}$ and the ground terminal.

The above conventional power-on reset circuit operates as hereinafter explained.

FIG. 7 shows in a graph a relationship of the output voltages Vb, Va, of the first and second reference potential circuits 21, 22, with respect to the power supply voltages $V_{DD}$.

Immediately after the rising of the power supply voltage, the diodes $D_{11}$ through $D_{15}$ are all in their OFF state, so that the output voltages Vb, Va of the first and second reference potential circuits 21, 22 are gradually increased coincidentally with the increase in the power supply voltage $V_{DD}$. Assuming that the threshold voltage at which each of the diodes $D_{11}$ through $D_{15}$ turns to its ON state is $V_F$, the current starts to flow in the diode $D_{14}$, $D_{15}$ at the point of time when the power supply voltage $V_{DD}$ becomes $V_{DD} > 2 \cdot V_F$. Subsequently, the output voltage Va outputted from the second reference potential circuit 22 changes as shown by the following equation (1):

$$Va = \frac{[V_{DD} - 2 \cdot V_F(i)] R_{14}}{R_{13} + R_{14}} + 2 \cdot V_F(i) \quad (1)$$

wherein $V_F(i)$ is a forward-direction drop voltage of one diode which appears when the current flowing in the first and second reference potential circuits 21, 22 is i. Thus, from this stage onward, the relation Vb > Va is maintained and the output of the comparator circuit 3 is rendered to the "High" level thereby having the reset state of the internal circuit started.

When the power supply voltage $V_{DD}$ increases further and becomes $V_{DD} > 3 \cdot V_F$, the current Vb starts to flow in the diodes $D_{11}$, $D_{12}$, $D_{13}$ and, thereafter, the output voltage Vb outputted from the first reference potential circuit 21 changes as shown by the following equation (2):

$$Vb = \frac{[V_{DD} - 3 \cdot V_F(i)] R_{12}}{R_{11} + R_{12}} + 3 \cdot V_F(i) \quad (2)$$

Therefore, where the resistance values of the resistors $R_{11}$ through $R_{14}$ is set to satisfy the relation $R_{14}/(R_{13}+R_{14}) > R_{12}(R_{11}+R_{12})$, the degree of an increase in the output voltage Va becomes larger than that of an increase in the output voltage Vb as the power supply voltage $V_{DD}$ rises with a consequence that the relation between the output voltages Vb and Va becomes Va > Vb at the point when the power supply voltage $V_{DD}$ reaches a predetermined voltage. The power supply voltage $V_{DD}$ at this point is a reset potential ($V_{RESET}$) and, thereafter, the reset operation in the internal circuit is released.

However, in the conventional power-on reset circuit explained above, when the power supply voltage $V_{DD}$ is $2 \cdot V_F$ or lower, the output voltages become Va = Vb resulting in a problem that the output of the comparator circuit 3 becomes unstable. In the case where a number n of diodes are connected in series, the output of the comparator circuit remains unstable until the power supply voltage $V_{DD}$ becomes $V_{DD} > n \cdot V_F$. For this reason, the power-on reset circuit of this kind is unsuited to be used in a system which requires guarantee of operation under voltages in the order of 1 to 2 V.

In a conventional power-on reset circuit, even when the elements used for the resistors and diodes forming the first and second reference potential circuits are of those having the same characteristics, there is no strong correlation between the characteristic curve of the output voltage Va and that of the output voltage Vb since the current values of the currents which flow in these reference potential circuits are not the same, which results in a problem that the reset voltage $V_{RESET}$ varies depending on the variations in the resistors and the diodes employed.

SUMMARY OF THE INVENTION

It is, therefore, an object of the invention to overcome the problems existing in the conventional power-on reset circuit and to provide an improved power-on reset circuit.

It is a further object of the present invention to provide a power-on reset circuit which properly operates even under low supply voltages and which is not influenced by variations in the elements of resistors and diodes used.

According to the present invention, the power-on reset circuit comprises a first and a second reference potential circuit and a comparator circuit. The first and second reference potential circuits are such that their output voltage curves with respect to the power supply voltages intersect at a predetermined power supply voltage. The comparator circuit compares output voltages of the first and second reference potential circuits. The first reference potential circuit comprises a first and a second power supply terminal, a first and a second resistor connected in series and a first non-linear resistor element circuit all connected between the first and second power supply terminals. Between the first and second resistors, there is a node forming an output terminal of the first reference potential circuit. The second reference potential circuit comprises a third, a fourth and a fifth resistor connected in series between the first and the second power supply terminal and a second non-linear resistor element circuit connected in parallel with respect to the fourth resistor. Between the third and fourth resistors, there is a node forming an output terminal of the second reference potential circuit.

According to the present invention, during the period from the time when the power supply voltage rises and to the time when the same reaches the threshold voltage of the first non-linear resistor element circuit, the output voltage of the first reference potential circuit is a value of the power supply voltage and the output voltage of the second reference potential circuit is a value of the voltage which is derived from the dividing of the power supply voltage by the third to fifth resistors. Consequently, the output level from the first reference potential circuit is always and necessarily higher than that from the second reference potential circuit.

When the power supply voltage rises to the extent allowing the second non-linear resistor element circuit to become conductive, the fourth resistor becomes short-circuited at its two ends, whereby the output voltage from the second reference potential circuit greatly rises causing the high and low relation of the output levels of the two reference potential circuits to be reversed. The voltage at this point may be used as a reset voltage for effecting the power-on reset operation.

According to the present invention, even when the power supply voltage is low, a change in the output voltage from the first reference potential circuit and that from the second reference potential circuit occur on characteristic lines different from each other, so that the two output voltages will never become the same value. This ensures that, even in a low power supply voltage region, the reset operation can be conducted properly.

Further, according to the present invention, when the first and second non-linear resistor element circuits both turn to their ON state, it is easy to render the values of the currents flowing in the first and second reference potential circuits to be the same with each other so that the reset voltage is not influenced by any variations in the elements involved and this ensures the stability of the reset operation.

BRIEF DESCRIPTION OF THE DRAWINGS

The above and other objects, features and advantages of the present invention will be apparent from the following description of preferred embodiments of the invention, with reference to the accompanying drawings, in which.

PREFERRED EMBODIMENTS OF THE INVENTION

Throughout the following explanation, similar reference symbols or numerals refer to the same or similar elements in all the figures of the drawings.

Figure 1:
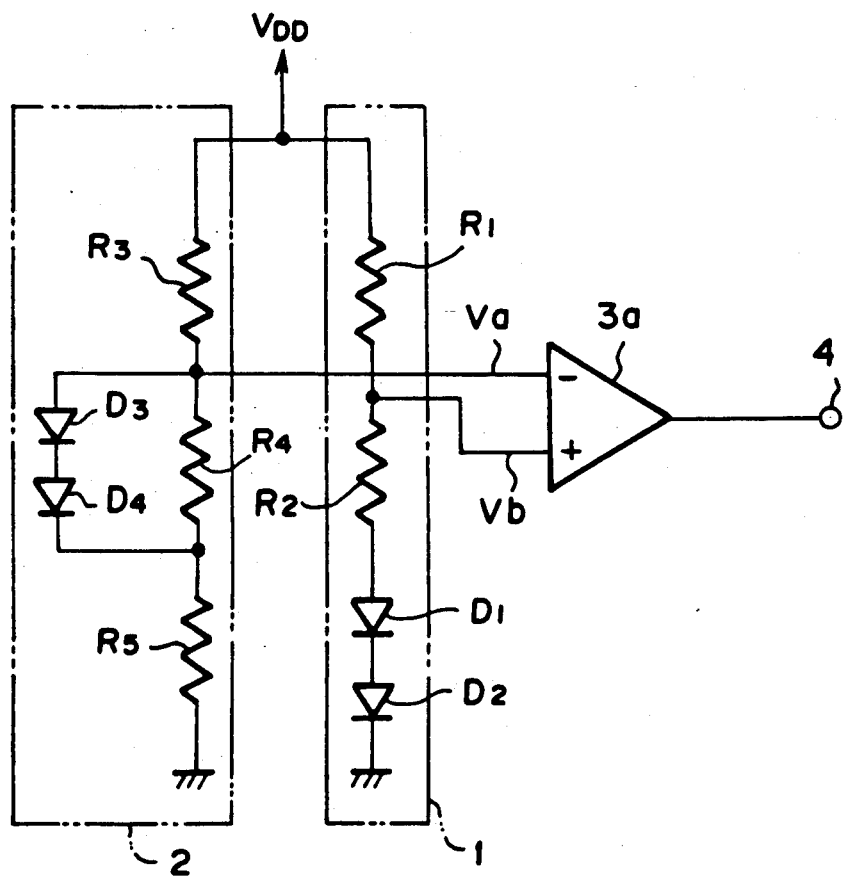
FIG. 1 is a circuit diagram showing a power-on reset circuit of a first embodiment according to the present invention.

FIG. 1 shows a power-on reset circuit of a first embodiment according to the invention. The circuit of this embodiment comprises a first reference potential circuit 1 which outputs an output voltage Vb, a second reference potential circuit 2 which outputs an output voltage Va and a comparator circuit 3a which compares the output voltage Vb of the first reference potential circuit 1 and the output voltage Va of the second reference potential circuit 2.

The first reference potential circuit 1 comprises resistors $R_1$, $R_2$ connected in series and a series circuit of diodes $D_1$, $D_2$ forming a first non-linear resistor element circuit all connected between the power supply terminal $V_{DD}$ and the ground terminal. The second reference potential circuit 2 comprises three resistors $R_3$, $R_4$, $R_5$ connected in series between the power supply terminal $V_{DD}$ and the ground terminal and a series circuit of diodes $D_3$, $D_4$ forming a second non-linear resistor element circuit connected in parallel with respect to the resistor $R_4$.

Figure 2:
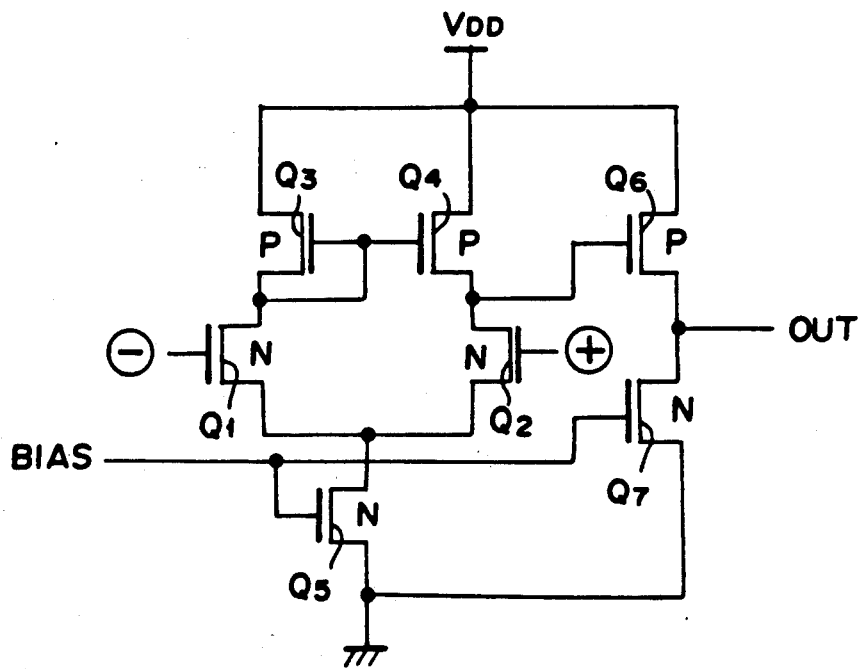
FIG. 2 is a detailed circuit diagram of a comparator in the power-on reset circuit shown in FIG. 1.

FIG. 2 is a circuit diagram showing details of the comparator circuit 3a which includes two input N-channel transistors $Q_1$, $Q_2$, two active load P-channel transistors $Q_3$, $Q_4$, an N-channel transistor $Q_5$ operating as a current source, and P- and N-channel transistors $Q_6$, $Q_7$ of an output stage connected in series.

Now, the actual operations of the power-on reset circuit having the above-explained circuit configuration will be explained.

Figure 3:
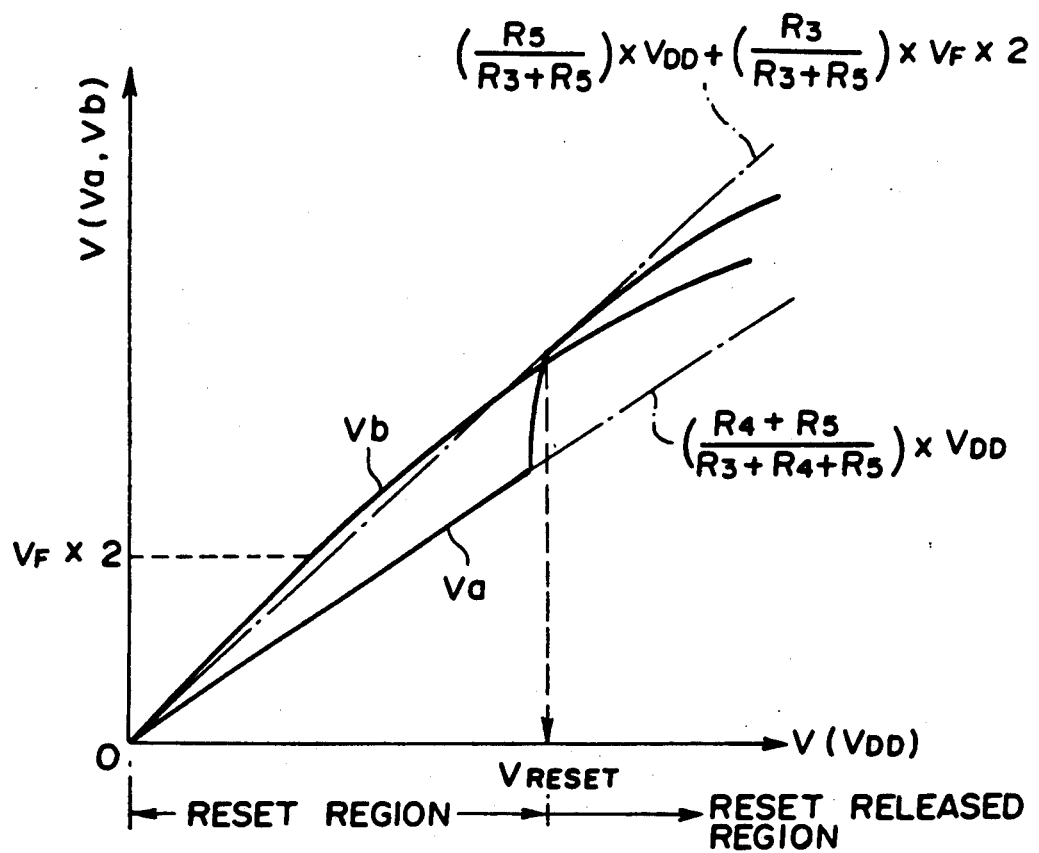
FIG. 3 is a graph showing the relation of output voltages of reference potential circuits with respect to the power supply voltages in the circuit of the first embodiment of the invention.

FIG. 3 is a graph showing the relation of the output voltages Vb and Va of the first and second reference potential circuits 1, 2 with respect to the power supply voltages $V_{DD}$.

Immediately after the power supply voltage $V_{DD}$ rises, all of the diodes $D_1$ through $D_4$ are in their OFF state. The output voltage Vb of the first reference potential circuit 1 changes in the voltage values identical to those in the power supply voltage $V_{DD}$ but the output voltage Va of the second reference potential circuit 2 presents a value with the power supply voltage $V_{DD}$ being divided by the three resistors $R_3$, $R_4$ and $R_5$ as shown by the following equation (3):

$$Va = \frac{R_4 + R_5}{R_3 + R_4 + R_5} V_{DD} \quad (3)$$

Thus, the relation Va<Vb is maintained from the outset of the power supply rise and this ensures a proper reset operation even in the region of low power supply voltage.

When the power supply voltage $V_{DD}$ reaches $2 \cdot V_F$, the diodes $D_1$, $D_2$ in the first reference voltage circuit 1 turn ON and the output voltage Vb thereof changes as shown by the following equation (4):

$$Vb = \frac{[V_{DD} - 2 \cdot V_{F(i)}] R_2}{R_1 + R_2} + 2 \cdot V_{F(i)} \quad (4)$$

Further, after the power supply voltage $V_{DD}$ has increased and the voltage across the resistor $R_4$ has reached a point where the relation $R_4 \cdot i \geq 2 \cdot V_F$ is satisfied, the diodes $D_3$, $D_4$ turn to their ON state and the output voltage Va of the first reference potential circuit 1 changes as shown by the following equation (5):

$$Va = \frac{[V_{DD} - 2 \cdot V_{F(i)}] R_5}{R_3 + R_5} + 2 \cdot V_{F(i)} \quad (5)$$

Thus, if the resistance values of the respective resistors $R_1$, $R_2$, $R_3$ and $R_5$ are set as $R_5/(R_3+R_5) > R_2/(R_1+R_2)$, the relation of the output voltages Va and Vb is reversed at a point where $R_4 \cdot i = 2 \cdot V_F$ is satisfied, whereby the relation becomes Va > Vb. The power supply voltage $V_{DD}$ at this point becomes the reset voltage $V_{RESET}$.

Here, if the resistors are set as $R_3 + R_5 = R_1 + R_2$ and the resistance value of the resistor $R_4$ is made sufficiently large so that the value of the current flowing to the resistor $R_4$ in which the power supply voltage $V_{DD}$ is further increased is very small as compared with the value of the current flowing to the diodes $D_3$, $D_4$ connected in series, it is possible to substantially equalize the values of the currents flowing in the first and second reference potential circuits 1, 2. This is how it is achieved for the characteristic curve of the output voltage Va and that of the output voltage Vb to have a strong correlation resulting in preventing any variations in element constant (e.g., a resistance value of each resistor and a threshold voltage of each diode) from affecting the reset voltage $V_{RESET}$.

Figure 4:
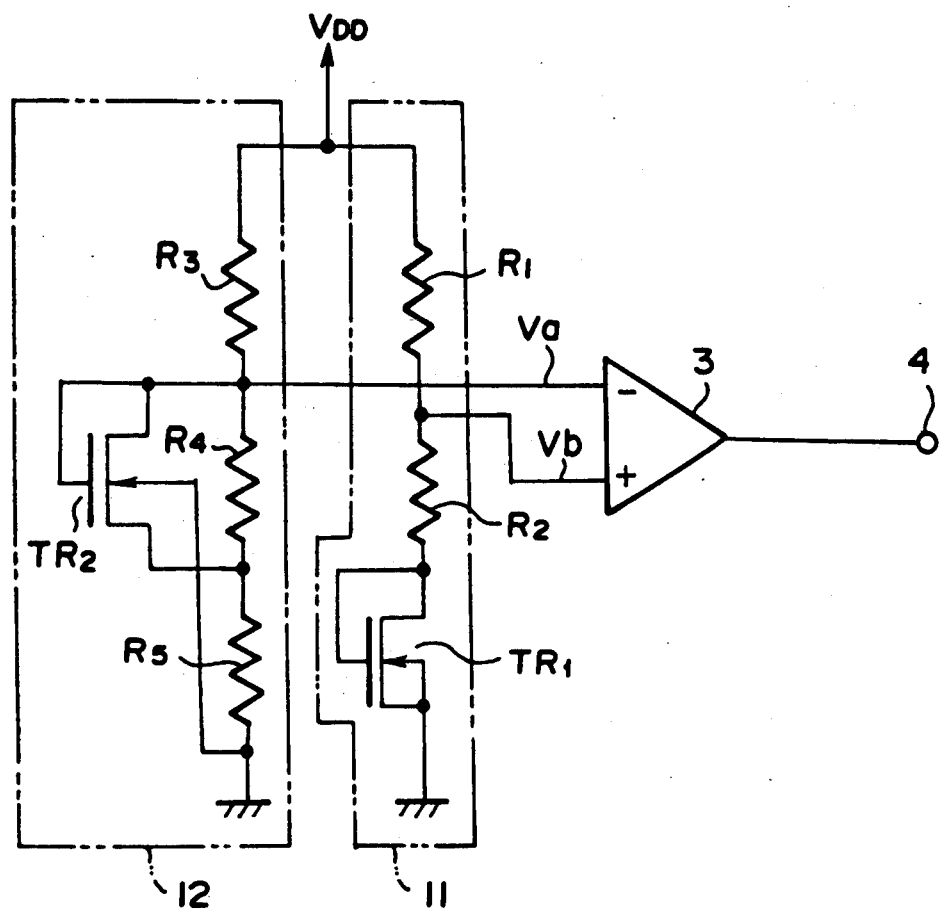
FIG. 4 is a circuit diagram showing a power-on reset circuit of a second embodiment according to the invention.
Figure 5:
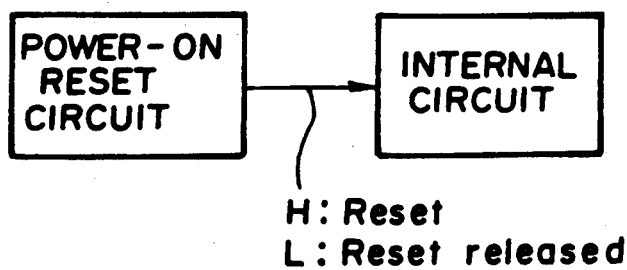
FIG. 5 is a block diagram showing a relationship between the power-on reset circuit and an internal circuit.
Figure 6:
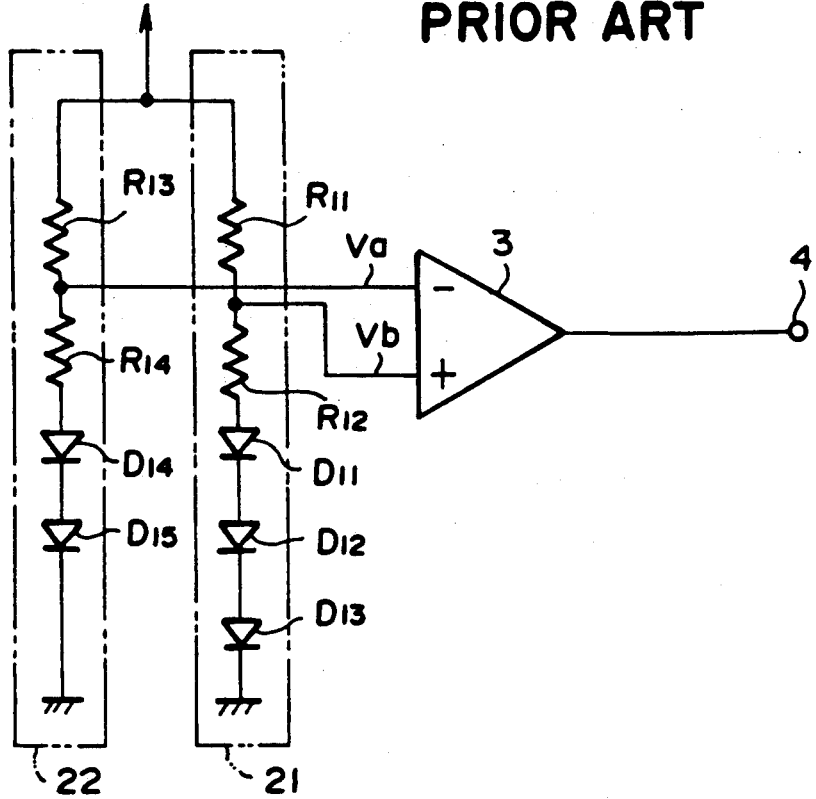
FIG. 6 is a circuit diagram showing a conventional power-on reset circuit.
Figure 7:
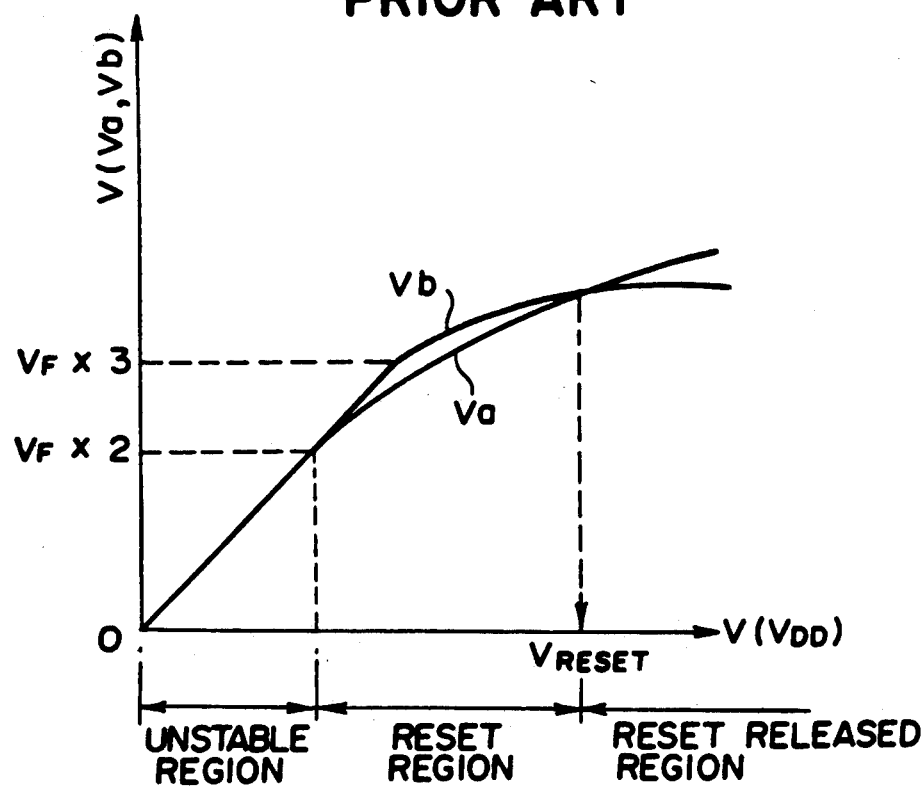
FIG. 7 is a graph showing the relation of output voltages of reference potential circuits with respect to the power supply voltages in the conventional circuit shown in FIG. 6.

FIG. 4 is a circuit diagram showing a power-on reset circuit of a second embodiment according to the present invention.

In the circuit of this embodiment, instead of the diodes $D_1$, $D_2$ and $D_3$, $D_4$ in the circuit of the first embodiment, N-channel field effect transistors $TR_1$, $TR_2$ are used as the first and second non-linear resistor element circuits thereby forming a first reference potential circuit 11 and a second reference potential circuit 12, respectively. Other remaining arrangements are the same as those in the circuit of the first embodiment shown in FIG. 1 and the description therefor is not repeated here.

The transistor $TR_1$ has its gate and drain connected together, its drain connected to the resistor $R_2$ and its source connected to the ground terminal. The transistor $TR_2$ has its gate and drain connected together, its drain connected to a junction of the resistors $R_3$, $R_4$, and its source connected to a junction of the resistors $R_4$, $R_5$.

According to this embodiment, since each of the transistors $TR_1$, $TR_2$ has its own gate and drain connected together, such transistor turns to its ON state when a voltage larger than the threshold voltage $V_T$ thereof is applied between the source and the drain. Therefore, all the explanation given above applies to the circuit of this second embodiment when only the threshold voltage $V_T$ of the transistor is replaced for the forward drop voltage $V_F$ of the diode in each of the related equations.

This second embodiment is especially advantageously utilized in a diffusion process with which there is a difficulty in forming such diodes as are not directly connected to the power supply potentials ($V_{SS}$, $V_{DD}$).

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A power-on reset circuit comprising:
   a first and a second power supply terminal;
   a first reference potential circuit including a first resistor, a second resistor and a first non-linear resistor element circuit all connected in series between said first and said second power supply terminal, said first and said second resistor having a node forming an output terminal;
   a second reference potential circuit including a third resistor, a fourth resistor and a fifth resistor all connected in series between said first and said second power supply terminal and a second non-linear resistor element circuit connected in parallel with said fourth resistor, said third and fourth resistors having a node forming an output terminal; and
   a comparator circuit whose input terminals are connected to said output terminals of said first and said second reference potential circuit.

2. A power-on reset circuit according to claim 1, in which each of said first and said second non-linear resistor element circuit comprises a plurality of diodes connected in series in the forward direction between said first and said second power supply terminal.

3. A power-on reset circuit according to claim 1, in which each of said first and said second non-linear resistor element circuit comprises a field effect transistor whose gate and drain are connected together.

4. A power-on reset circuit according to claim 1, in which said first and second power supply terminals are connected to a positive power supply potential and a ground potential, respectively.

5. A power-on reset circuit having a first and a second power supply terminal; a first and a second reference potential circuit whose output voltage curves with respect to the power supply voltages intersect with each other at a predetermined power supply voltage; and a comparator circuit which compares output voltages of said first and said second reference potential circuit,
   said first reference potential circuit comprising a first resistor, a second resistor and a first non-linear resistor element circuit all connected in series between said first and said second power supply terminal, said first and said second resistor having a node forming an output terminal connected to one input terminal of said comparator circuit; and
   said second reference potential circuit comprising a third resistor, a fourth resistor and a fifth resistor all connected in series between said first and said second power supply terminal and a second non-linear resistor element circuit connected in parallel with said fourth resistor, said third and fourth resistors having a node forming an output terminal connected to the other input terminal of said comparator circuit.

* * * * *